United States Patent [19]

Ward

[11] Patent Number: 4,462,011
[45] Date of Patent: Jul. 24, 1984

[54] LOW DRIFT RELATIVE PHASE SENSOR EMPLOYING SURFACE ACOUSTIC WAVES

[75] Inventor: Robert B. Ward, Mt. View, Calif.
[73] Assignee: Lockheed Missiles & Space Company, Inc., Sunnyvale, Calif.
[21] Appl. No.: 453,277
[22] Filed: Dec. 27, 1982
[51] Int. Cl.³ .............. H03H 9/145; H03H 9/76; H03H 9/66
[52] U.S. Cl. .............. 333/154; 310/313 R; 333/155; 324/82
[58] Field of Search .............. 333/150-155, 333/193-196; 331/107 A; 310/313 R, 313 A, 313 B, 313 C, 313 D; 324/82, 80; 364/821

[56] References Cited

U.S. PATENT DOCUMENTS 3,548,306 12/1970 Whitehouse .............. 333/154 X
3,727,718 4/1973 Whitehouse .............. 333/154 X
4,078,210 3/1978 Lewis .............. 331/107 A Primary Examiner—Marvin L. Nussbaum
Attorney, Agent, or Firm—H. Donald Volk

[57] ABSTRACT

Pairs of input transducers are formed on the surface of a piezoelectric crystalline body. The input transducers in each pair produce adjacent parallel surface acoustic waves of opposite polarity and specific phase difference which are sensed by a corresponding output transducer. The input transducers of each pair are offset from one another by amounts related to the wavelength of the surface acoustic wave so that a maximum cancellation of the voltages induced in the output transducers by the acoustic waves can be used to indicate the relative delay or phase difference of signals applied to the input terminals and to do so in a manner which is insensitive to temperature variation from one point to another in the piezoelectric crystal.

4 Claims, 7 Drawing Figures

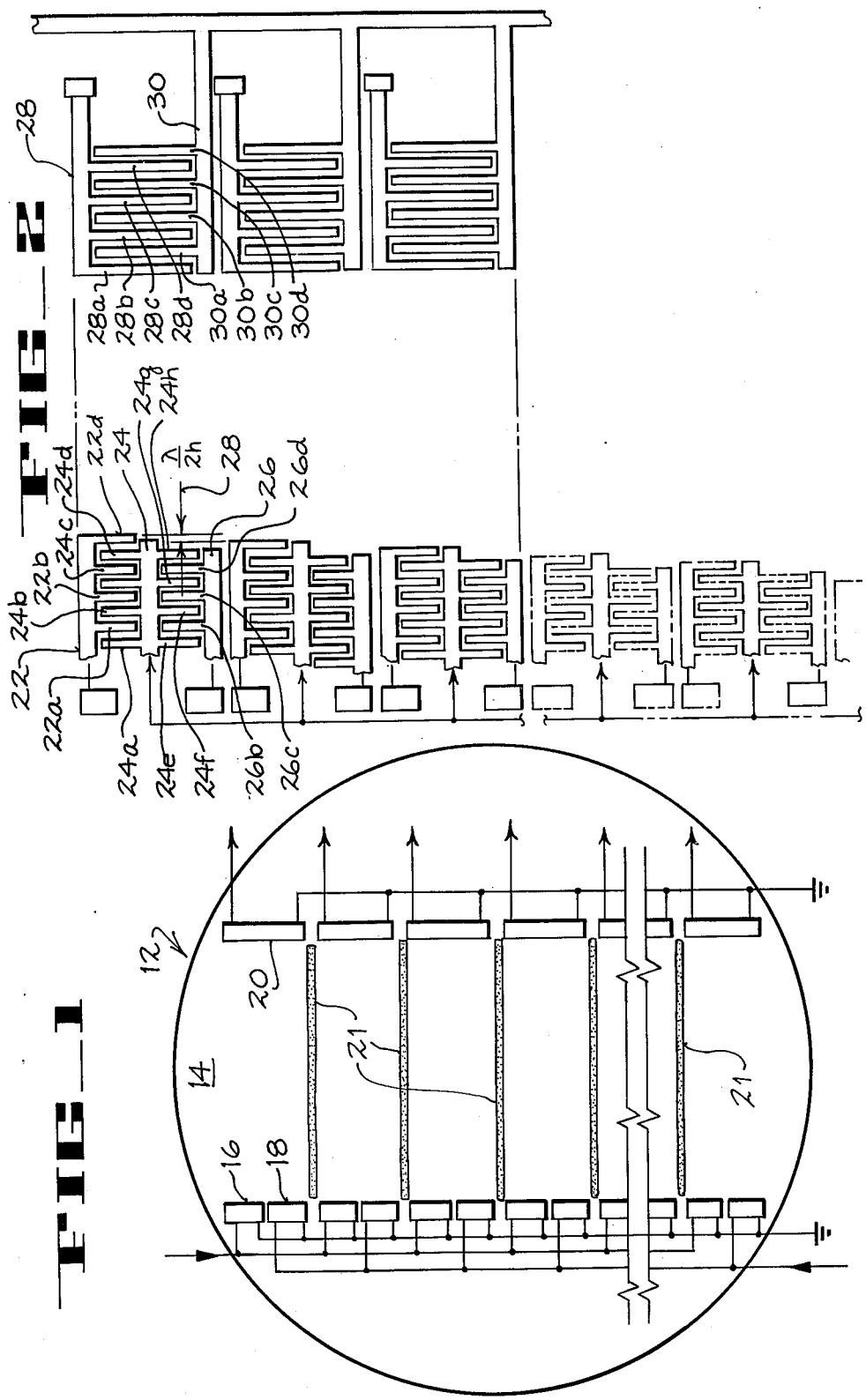

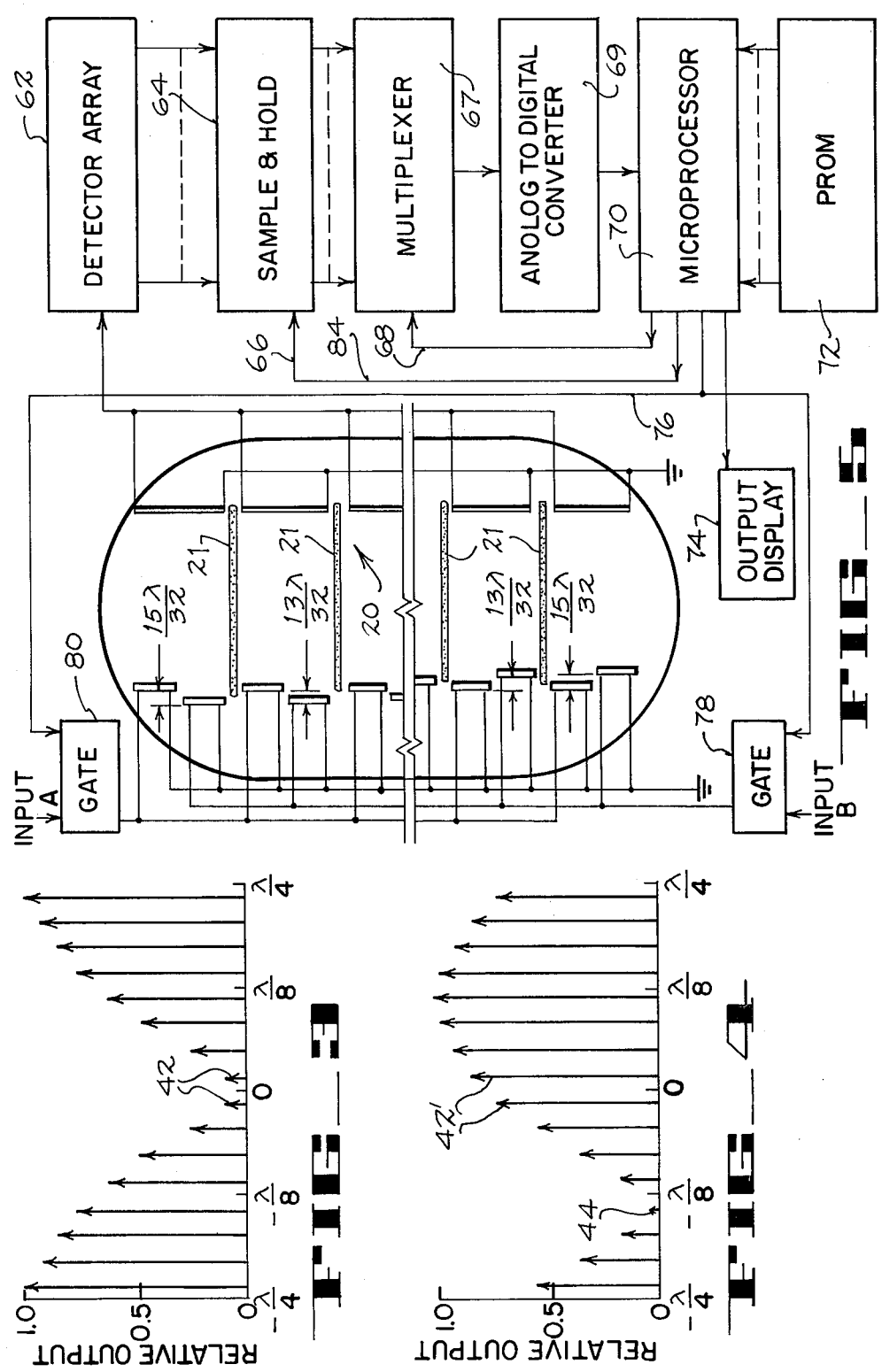

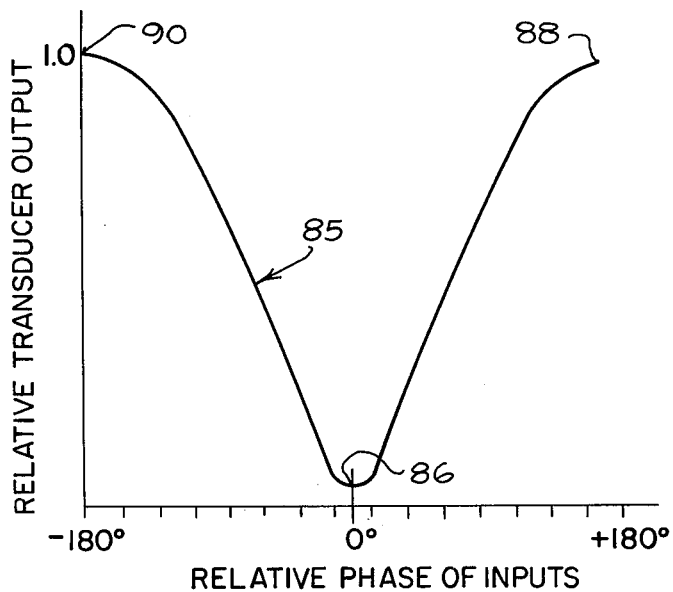
FIG_6
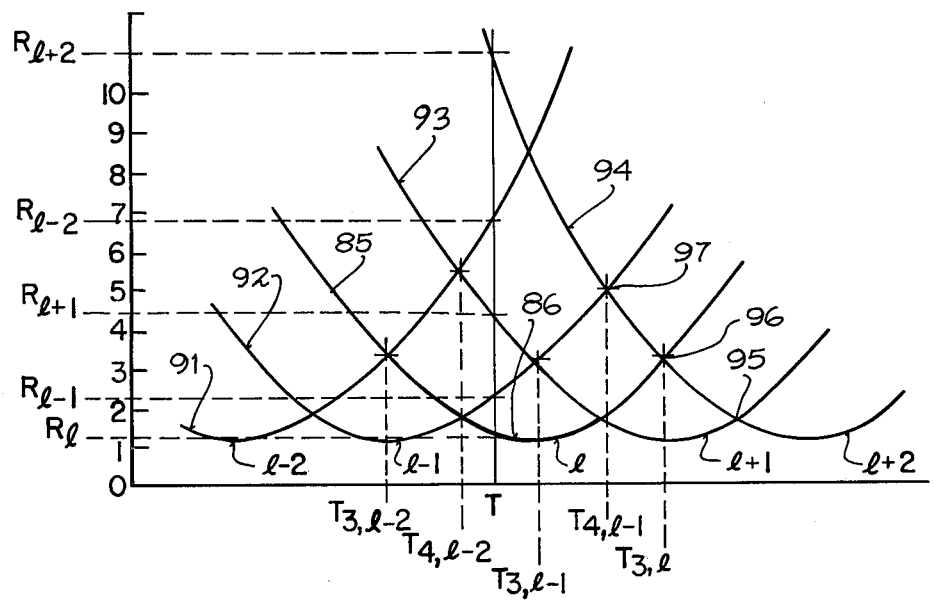
FIG_7

LOW DRIFT RELATIVE PHASE SENSOR EMPLOYING SURFACE ACOUSTIC WAVES

TECHNICAL FIELD

This invention relates to a sensor for sensing the relative phase between two signals of like wave form that is insensitive to temperature difference caused drift and more particularly to such a device employing surface acoustic waves.

Background Art

Production of surface acoustic waves in crystalline substrates of lithium niobate and the like and the utilization of this phenomena has been employed to produce numerous useful devices. A description of the generation of surface acoustic waves in crystalline substrates is set forth in "Surface Wave Filters", Herbert Matthews, Ed., John Wiley & Sons, Copyright 1977.

U.S. Pat. No. 4,016,513 discloses a convolver having two interdigital acoustoelectric transducers mounted on a crystalline surface in spaced apart relationship. Mounted between the two input transducers is an output transducer which is oriented obliquely to the input transducers.

U.S. Pat. No. 4,024,480 discloses a filter having two closely spaced input transducers formed on a crystalline surface and a plurality of staggered output transducers disposed on the surface at a remote location. The individual output transducers are oriented in an oblique or staggered position and constitute taps on a delay line. The amount of delay occurring at a given output transducer is a function of its physical location with respect to the location of input transducers.

U.S. Pat. No. 4,114,116 discloses a surface acoustic wave signal processor having two obliquely oriented input transducer arrays and a plurality of output transducers formed on a line normal to the surface acoustic waves produced by the input transducer arrays. Each individual transducer in the input arrays is spaced from the transducer adjacent to it by a multiple of the wave length of the acoustic wave so as to produce at each individual output transducer a unique combination of the signals applied to the input transducers.

U.S. Pat. No. 4,321,565, by the same inventor, and assigned to the same assignee as the present application, discloses a surface acoustic wave phase sensor having two spaced apart input transducers formed on a crystalline surface. A plurality of output transducers offset from one another by a small fraction of the wave length of the acoustic wave are disposed on the surface between the input transducers to produce at each output transducer a uniquely-phased combination of the signals applied to the input transducers. This configuration produces a device which is insensitive to temperature change of the entire substrate but is not insensitive to temperature difference in the substrate.

DISCLOSURE OF INVENTION

According to the present invention, a plurality of offset pairs of input transducers each having a different offset are formed on the surface of a piezoelectric crystalline body or substrate. Two input signals, the delay/phase between which is to be sensed, are applied to each pair of input transducers in such a way that opposite polarity, parallel propagating acoustic waves are produced on the body surface. On the surface of the substrate remote from the input transducers and parallel to the input transducers are formed a plurality of output transducers. The opposite polarity parallel propagating acoustic waves from each pair of input terminals impinge on an output transducer to produce an output signal having a magnitude related to the relative phase or delay between the two signals applied to that pair of input transducers and to the offset of that input transducer pair. The offsets of the input transducer pairs vary in small fractions of an acoustic wavelength to produce at the output transducers a set of uniquely-phased combinations of the signals applied to the input transducers. By ascertaining the location of the specific output transducer having the minimum amplitude output, an indication of the relative delay or phase between the two input signals is obtained.

Further understanding of the present invention can be had by appreciating that for many good substrate materials, including $LiNbO_3$, the propagation speed of surface acoustic waves in a function of the substrate temperature. Therefore, in a substrate of non-uniform temperature two surface acoustic waves which reach an output transducer by traveling close parallel paths as in the present invention will generally have their relative phase less altered when they reach the output than two acoustic waves which travel widely spaced paths to reach the same output transducer. Since in the present invention the acoustic wave pairs each travel adjacent paths, the effect of non-uniform substrate temperature is minimized.

The foregoing features and advantages will be more apparent after referring to the following specifications and the accompanying drawings.

BRIEF DESCRIPTION OF THE DRAWINGS

FIG. 1 is a top view of a device embodying the invention.

FIG. 2 is a top view of FIG. 1 at an enlarged scale showing the physical relationship between the input transducer pairs and the output transducers.

FIG. 3 is a plot showing the signals at the output transducers when the input signals are in phase.

FIG. 4 is a view similar to FIG. 5 showing the condition of the output transducers when the two input signals are about −100 degrees out of phase.

FIG. 5 is a schematic circuit diagram showing one form of output circuitry for the sensor of FIG. 1.

FIG. 6 is a plot for an exemplary individual output transducer of output magnitudes versus phase or delay difference of the input signals.

FIG. 7 is a plot similar to FIG. 6 showing fragments of the output curves for several adjacent output transducers.

DETAIL DESCRIPTION OF THE PREFERRED EMBODIMENTS

Referring more particularly to the drawings, in FIG. 1 reference numeral 12 indicates a body of piezoelectric material such as y-cut lithium niobate. Body 12 can have a diameter of about 2 inches and a thickness of about 0.020 inches. Body 12 has a flat smooth surface 14 on which is formed a group plurality of pairs of input transducers 16 and 18 and a plurality of output transducers 20 are disposed opposite from an extending parallel to the pairs of input transducers. A damping strip 21 that extends from the input transducers to the output transducers may be disposed on the surface between adjacent pairs of input transducers. The purpose of the damping strip, which may be wax or the like, is to reduce the crosstalk between adjacent input transducer pairs.

The three pairs of input transducers and the three corresponding output transducers shown in FIG. 2 are an enlarged representative portion of the input and output transducers shown in FIG. 1. Input transducer 16 include an upper input terminal or pad 22 and a lower terminal or pad 24. Extending from each of the pads are conductive paths or fingers which are interdigitated. More specifically, fingers 22a, 22b, 22c and 22d extend from pad 22. Similarly, fingers 24a, 24b, 24c and 24d extend from pad 24. In one sensor designed in accordance with the invention, on a lithium niobate substrate the width of each finger and the space between adjacent fingers is equal to about 12 microns. In such design the average frequency of the surface acoustic waves is 70 MHz, a frequency compatible with the above-noted dimensions. In such design the overall length of the input transducer is about one mm. The preceding specifics are intended to be exemplary, not limiting.

Input transducer 18 is of similar construction to input transducer 16. Input transducer 18 shares the ground pad 24 with input transducer 16 as its upper pad and includes a lower terminal or pad 26. Extending downward from pad 24 are conductive fingers 24e, 24f, 24g and 24h. Extending upward from pad 26 are fingers 26a, 26b, 26c and 26d which are interdigitated with fingers 24e–24h. A critical relationship between the input transducers is the horizontal offset of the transducers which for the purpose of clarity is exaggerated in FIG. 2 and is indicated at 28. Input transducers 16 are offset from their corresponding transducers 18 by increments of $\lambda/16$, which is about 3 microns in the case of Z-propagating acoustic waves on y-cut lithium niobate at 70 MHz in a system having 16 pairs of input transducers and 16 corresponding output transducers.

Each of the output transducers 20 shown in FIG. 2 is of substantially identical design. Each output transducer includes an upper connecting pad 28 and a lower connecting pad 30. Extending downward from pad 28 are conductive fingers 28a, 28b, 28c and 28d. Extending upward from pad 30 are fingers 30a, 30b, 30c and 30d which are interleaved with fingers 28a–28d.

Surface acoustic waves from input transducers 16 and 18 approach the output transducer with a relative phase which depends on the relative phase of the input signals and the offset of the input transducer pair from which the waves came. Because the offset is smallest near the center of the input transducer pair array and the input pair finger-to-pad connections produce opposite polarity acoustic waves, equal phase input signals produce maximum cancellation near the center transducer of the output array and maximum reinforcement near the end transducers of the output array. Because the offset is near $\lambda/2$ for the input pairs at the ends of the input array, maximum cancellation for opposite phase input signals occurs near the end transducers of the output array. Accordingly, the position of the output transducer that experiences maximum cancellation is indicative of the relative delay or phase of the two input signals.

Referring to FIG. 3, there are 16 arrows, each of which represents the output signal across one output transducer, the vertical dimension of the arrow representing the magnitude of the signal. Equal minimum signals are represented by arrows 42. Because the input transducer pairs corresponding to the outputs represented by arrows 42 have offsets near zero, minimum signals at output transducers 8 and 9 indicates that the signals applied to the input transducers are in phase with one another.

In FIG. 4 the outputs of the output transducers for a condition different from the in-phase condition is shown. It will be noted that the output signals from transducers 8 and 9 have output $42^1$ which is not a minimum. Rather, the output of the transducer having the minimum output is indicated at 44 and corresponds to a phase difference between the two input signals of 101.25°.

A circuit for permitting identification of the transducer having the lowest output which in turn affords an indication of relative delay or phase between the signals at the input transducers is shown in FIG. 5 of U.S. Pat. No. 4,321,565.

The circuit shown in FIG. 6 of U.S. Pat. No. 4,321,565 produces an output that is more accurate than that provided by the circuit 5 of the same patent. Since the circuit illustrated in FIG. 6 of U.S. Pat. No. 4,321,565 is the preferred circuit for use with the present invention, it will hereinafter be set forth.

The circuit shown in FIG. 5 provides accurate interpolation of the relative phase or delay difference indication when no output transducer is experiencing maximum possible cancellation of the incident acoustic waves.

Each output transducer group 20 is connected to a detector array 62, which has one output conductor for each output transducer; the output conductor contains a voltage having a magnitude proportional to the voltage produced across each output transducer in response to reception thereby of interfering surface acoustic waves from input transducers 16 and 18. Such voltage signals on the outputs of detector array 62 are supplied to and stored in a sample and hold circuit 64. Because the sample and hold circuit is old per se, its details of construction are not described. Suffice to say, the sample and hold circuit has one output conductor corresponding to each of the output transducers on body 12. The voltage signals in sample and hold circuit 64 are retained until a trigger signal is applied to a trigger input 66 on the sample and hold circuit. The outputs of sample and hold circuit 64 are connected to a multiplexer 67 which serializes the readings stored in sample and hold circuit 64 under the control of a control pulse applied to a control terminal 68. The multiplexed readings from multiplexer 67 are coupled to an analog-to-digital converter 69. The converter 69 produces an output reading which is a digitized form of the analog signal produced at the respective output transducers.

The output of analog-to-digital converter 69 is coupled to a microprocessor 70 which is a conventional element and, as will be explained, is programmed to compute the relative phase or delay difference of the signals applied to input transducers 16 and 18 on piezoelectric body 12. Microprocessor 70 uses the signals from analog-to-digital converter 69 and signals from a PROM 72 to poduce on an output display 74 an indication of the relative phase or delay difference of the signals supplied to input transducers 16 and 18. The operation of the microcomputer and the contents of PROM 72 will be explained in somewhat more detail hereinbelow. Additionally, the microprocessor produces a gating signal on an output path 76 which controls gates 78 and 80, through which the input signals are applied to input transducers 16 and 18. Gates 78 and 80 supply input signals to the input transducers for a relatively short duration, a duration greater than the time needed for surface acoustic waves to travel from the input transducers to the output transducers in group 20 but less than the time which permits any reflected acoustic signals to influence the signals produced in the output transducers. For example, in one transducer 12 constructed in accordance with the invention, the signal produced on path 76 opens gates 78 and 80 for about 3 μsec, which is sufficient for the output transducers to react to the acoustic waves from the input transducers but insufficient for significant influence on the output transducers by reflected acoustic waves. Microprocessor 70 also produced on a circuit path 84 a clear signal, which is connected to the control terminal of sample and hold circuit 64 so as to clear the circuit prior to receiving additional inputs from detector array 62 and the output transducers in group 20.

Microprocessor 70 selects the transducer in group 20 having the lowest output and can produce on output display 74 an indication of relative phase corresponding with such individual output transducer. It is preferred, however, to program the microprocessor so that it can interpolate phase differences between the discrete phase differences represented by the various output transducers. For example, in the case where there are 16 output transducers in group 20 and the input transducers are step offset from one another, selecting the single transducer having the lowest output produces an accuracy within about ±11.25° (180°/16=11.25°). Far greater accuracy than this can be achieved by measuring the outputs at the two adjacent output transducers having minimum magnitudes and interpolating therebetween, or by measuring the outputs of several adjacent output transducers and interpolating with a more complex algorithm.

The response of a single output transducer, which is typical of all other output transducers, is shown in FIG. 6 at 85. When the phase between the input signals is such that there is maximum interference between the surface acoustic waves arriving at the output transducer, the output of the output transducer is a minimum as indicated at 86. When the relative phase is +180° from the minimum, the signal across the output transducer is at a maximum 88 and when the relative phase is −180° from the minimum, the output of the output transducer is at a maximum 90. This phenomenon can also be analyzed in terms of the delay between the two input signals.

A fragment of response curve 85 is shown in FIG. 7 with the response curves of two adjacent output transducers on each side of the transducer having response curve 85. In FIG. 7 are shown response curves 91 and 92 for two transducers on one side of the transducer having response curve 85 and curves 93 and 94 for two transducers on the other side of such transducer. The position along the horizontal axis of FIG. 7 of minimum 86 of curve 85 will be assumed in the ensuing description to represent zero delay difference between the signals applied to input transducers 16 and 18. Each of curves 91–94 has a minimum at a different location along the horizontal axis of FIG. 7. The positions of the minima of the respective response curves can be considered first order parameters of the set of curves of FIG. 7. Because each minimum occurs in a portion of the curve that is relatively flat, ascertainment or measurement of the precise location of the minimum is difficult.

Accordingly, higher order parameters, points of intersection between the various response curves, are used and give better accuracy. There are second order parameters, an exemplary one of which is indicated at 95, third order parameters, an exemplary one of which is indicated at 96, and fourth order parameters, one of which is indicated at 97. An operable system employing the third and fourth order parameters will be described.

In the following description the output transducer that produces the minimum output signal will be identified as transducer l. Accordingly in FIG. 7 curve 85 is also identified as l. Curve 93 is identified as $l+1$, curve 94 is identified as $l+2$, curve 92 is identified as $l-1$ and curve 91 is identified as $l-2$. The curve l refers to the curve associated with the output transducer that produces the lowest output signal in response to application of input signals to input transducers 16 and 18. Microprocessor 70 is programmed to ascertain which of the output transducers has the lowest output and to identify l.

In the case of a device having 16 output transducers and 16 curves of the type shown in FIG. 7, there are 16 third order intersection points 96 and 16 fourth order intersection points 97. The relative delay as measured on the abscissa of FIG. 7 of each of the 32 points is stored in PROM 72. For each individual device the stored numbers will be different because of such variables as differences in the smoothness of surface 14, differences in the accuracy with which the output transducers in group 20 are formed, and like manufacturing variables.

In FIG. 7 there are shown three third order points and two fourth order points. Each of the third order points is identified by the reference character $T_3$ (the subscript indicating a third order point) and an additional subscript indicating the transducer with which it is associated. Thus there are third order points $T_{3,l-2}$; $T_{3,l-1}$; and $T_{3,l}$. In addition, there are fourth order points identified as $T_{4,l-1}$ and $T_{4,l-2}$.

The foregoing parameters are employed in microprocessor 70 in accordance with the following algorithms:

$$T = T_{3,l-1} - (T_{3,l-1} - T_{4,l-2})\frac{R_{l+1} - R_{l-1}}{R_{-2} - R_{-1}}, R_{l-1} < R_{l+1}$$

$$T = T_{3,l-1} + (T_{4,l-1} - T_{3,l-1})\frac{R_{l-1} - R_{l+1}}{R_{l+2} - R_{l-1}}, R_{l+1} \quad R_{l-1}$$

In the above algorithms, R denotes a reading of the voltage across an output transducer identified by the subscript. Such readings are supplied to microprocessor 70 from analog-to-digital converter 69. The microprocessor also determines the relative magnitude of $R_{l+1}$ and $R_{l-1}$ so as to operate in accordance with the appropriate equation of the algorithm.

The operation of the circuit shown in FIG. 5 in performing one of the above noted algorithms will be explained in connection with FIG. 7. It should be assumed that the signals applied to input transducers 16 and 18 are delayed from one another by the time T indicated on the abscissa in FIG. 7. It will be noted that minimum 86 of curve 85 is closest to T so that curve 85 will be identified as curve l. The readings produced by the output transducers are shown on the ordinate of FIG. 7, such readings being $R_l$, $R_{l-1}$, $R_{l+1}$, $R_{l-2}$, and $R_{l+2}$. Such numbers are supplied to microprocessor 70 from analog-to-digital converter 69. The values, in nanoseconds of delay, of the third and fourth order points are supplied to the microprocessor from PROM 72. Such readings and points are utilized to compute the value of T which is in the same units as those along the abscissa of FIG. 7. Such solution is displayed on output display 74.

Thus it can be seen that the present invention provides a transducer that provides an indication of the delay difference between the two signals of like wave form that are applied to the transducer. Significant accuracy can be achieved, particularly where a microprocessor is employed to interpolate when no output transducer is experiencing maximum possible interference. Moreover, with the use of modern fabrication techniques, the transducers can be produced with great accuracy and uniformity. Finally, because the relative phase can be determined from the delay and the frequency of the surface acoustic waves, the invention can be readily adapted to measure the relative phase between two input signals.

Although several embodiments of the invention have been shown and described, it will be obvious that other adaptions and modifications can be made without departing from the true spirit and scope of the invention.

I claim:

1. A sensor for sensing the delay difference between first and second signals having substantially identical wave forms comprising a piezoelectric body having a surface, a row of n first and second input transducer pairs disposed on said surface in a first direction, said pairs of input transducers being offset from one another by offset distances each bearing a relationship of $\lambda/16$ means for coupling said first and second signals to said first and second input transducers, respectively, so that parallel acoustic waves of a wavelength $\lambda$ are produced on the active region of said surface, said surface acoustic waves traveling in a second direction normal to the row of said first and second transducer pairs, a row of output transducers disposed on said surface substantially parallel to said first and second transducer pairs so that the amplitude of the signal produced at each output transducer by interference between input signals from said first and second transducers of the corresponding pair represents a discrete delay difference between said first and second signals coupled to said input transducers.

2. A sensor according to claim 1 wherein each of said first and second input transducers comprises an interdigital acoustoelectric transducer and wherein each of said output transducers comprises an interdigital acoustoelectric transducer.

3. A sensor in accordance with claim 2 in combination with a plurality of circuits coupled to said output transducers for detecting the magnitude of the signal thereacross and detector means coupled to said circuits for identifying the output transducer having the lowest signal thereacross.

4. A sensor in accordance with claim 3 wherein there are n output transducers.

* * * * *